United States Patent
Eggers

(10) Patent No.: US 12,140,653 B2
(45) Date of Patent: Nov. 12, 2024

(54) DIXON-TYPE WATER/FAT SEPARATION MR IMAGING

(71) Applicant: KONINKLIJKE PHILIPS N.V., Eindhoven (NL)

(72) Inventor: Holger Eggers, Ellerhoop (DE)

(73) Assignee: Koninklijke Philips N.V., Eindhoven (NL)

( * ) Notice: Subject to any disclaimer, the term of this patent is extended or adjusted under 35 U.S.C. 154(b) by 422 days.

(21) Appl. No.: 17/641,829

(22) PCT Filed: Sep. 11, 2020

(86) PCT No.: PCT/EP2020/075444
§ 371 (c)(1),
(2) Date: Mar. 10, 2022

(87) PCT Pub. No.: WO2021/052882
PCT Pub. Date: Mar. 25, 2021

(65) Prior Publication Data
US 2022/0390538 A1    Dec. 8, 2022

(30) Foreign Application Priority Data
Sep. 16, 2019 (EP) ..................................... 19197456

(51) Int. Cl.
*G01V 3/00* (2006.01)
*G01R 33/48* (2006.01)
(Continued)

(52) U.S. Cl.
CPC ....... *G01R 33/4828* (2013.01); *G01R 33/485* (2013.01); *G01R 33/5608* (2013.01); *G01R 33/5611* (2013.01)

(58) Field of Classification Search
CPC .............. G01R 33/3415; G01R 33/543; G01R 33/5659; G01R 33/36; A61B 5/055
(Continued)

(56) References Cited

FOREIGN PATENT DOCUMENTS

| EP | 2495579 A1 * | 9/2012 | ........... G01R 33/448 |
|---|---|---|---|
| WO | 2011080693 A1 | 7/2011 | |
| WO | 2018114554 A1 | 6/2018 | |

OTHER PUBLICATIONS

Eggers et al "Dual-Echo Dixon Imaging with Flexible Choice of Echo Times" Magnetic Resonance in Med. vol. 65, 2011 p. 96-107.
(Continued)

*Primary Examiner* — Walter L Lindsay, Jr.
*Assistant Examiner* — Frederick Wenderoth

(57) ABSTRACT

The invention relates to a method of Dixon-type MR imaging of an object (10) placed in an examination volume of a MR device (1). It is an object of the invention to provide a method that enables an improved Dixon water/fat separation in combination with a dual-acquisition gradient-echo imaging sequence. The method comprises the steps of: —subjecting the object (10) to a dual-acquisition gradient-echo imaging sequence comprising a series of temporally equidistant RF excitations, wherein one gradient echo is generated in each repetition time between successive RF excitations with the echo time alternating between a first and a second value (TE1, TE2), and wherein phase-encoding magnetic field gradients (P, S) are switched in each repetition time to sample a pre-defined region of k-space; —acquiring echo signals from the object (10), wherein each gradient echo associated with either the first or the second echo time value (TE1, TE2) is sampled as a partial echo, and —reconstructing an MR image from the acquired echo signals, whereby signal contributions from water and fat are separated. Moreover the invention relates to an MR device
(Continued)

(1) and to a computer program to be run on an MR device (1).

8 Claims, 4 Drawing Sheets

(51) Int. Cl.
*G01R 33/485* (2006.01)
*G01R 33/56* (2006.01)
*G01R 33/561* (2006.01)

(58) Field of Classification Search
USPC .......................................................... 324/309
See application file for complete search history.

(56) References Cited

OTHER PUBLICATIONS

Eggers et al "Chemical Shift Encoding Based Water Fat Separation Methods" Journal of Magnetic Resonance Imaging 2014 vol. 40, p. 251-268.
Ryden et al "T1 Weighted Fat/Water Separated Propeller Acquired with Dual Bandwidths" Magnetic Resonance in Med. vol. 80 No. 6 Apr. 24, 2018 p. 2501-2513.
International Search Report and Written Opinion from PCT/EP2020/07544 mailed Nov. 13, 2020.

* cited by examiner

PRIOR ART

DIXON-TYPE WATER/FAT SEPARATION MR IMAGING

CROSS REFERENCE TO RELATED APPLICATIONS

This application is a U.S. national phase application of International Application No. PCT/EP2020/075444 filed on Sep. 11, 2020, which claims the benefit of EP Application Ser. No. 19/197,456.7 filed on Sep. 16, 2019 and is incorporated herein by reference.

FIELD OF THE INVENTION

The invention relates to the field of magnetic resonance (MR) imaging. It concerns a method of MR imaging of a portion of a body placed in the examination volume of an MR device. The invention also relates to an MR device and to a computer program to be run on an MR device.

BACKGROUND OF THE INVENTION

Image-forming MR methods which utilize the interaction between magnetic fields and nuclear spins in order to form two-dimensional or three-dimensional images are widely used nowadays, notably in the field of medical diagnostics, because for the imaging of soft tissue they are superior to other imaging methods in many respects, do not require ionizing radiation and are usually not invasive.

According to the MR method in general, the body of the patient to be examined is arranged in a strong, uniform magnetic field $B_0$ whose direction at the same time defines an axis (normally the z-axis) of the co-ordinate system on which the measurement is based. The magnetic field $B_0$ produces different energy levels for the individual nuclear spins in dependence on the magnetic field strength which can be excited (spin resonance) by application of an electromagnetic alternating field (RF field) of defined frequency (so-called Larmor frequency, or MR frequency). From a macroscopic point of view the distribution of the individual nuclear spins produces an overall magnetization which can be deflected out of the state of equilibrium by application of an electromagnetic pulse of appropriate frequency (RF pulse) perpendicular to the z-axis, so that the magnetization performs a precessional motion about the z-axis. The precessional motion describes a surface of a cone whose angle of aperture is referred to as flip angle. The magnitude of the flip angle is dependent on the strength and the duration of the applied electromagnetic pulse. In the case of a so-called 90° pulse, the spins are deflected from the z-axis to the transverse plane (90° flip angle).

After termination of the RF pulse, the magnetization relaxes back to the original state of equilibrium, in which the magnetization in the z direction is built up again with a first time constant $T_1$ (spin-lattice or longitudinal relaxation time), and the magnetization in the direction perpendicular to the z direction relaxes with a second time constant $T_2$ (spin-spin or transverse relaxation time). The variation of the magnetization can be detected by means of receiving RF coils which are arranged and oriented within an examination volume of the MR device in such a manner that the variation of the magnetization is measured in the direction perpendicular to the z-axis. The decay of the transverse magnetization is accompanied, after application of, for example, a 90° pulse, by a transition of the nuclear spins (induced by local magnetic field inhomogeneities) from an ordered state with the same phase to a state in which all phase angles are uniformly distributed (dephasing). The dephasing can be compensated by means of a refocusing pulse (for example a 180° pulse). This produces an echo signal, which can also be detected by means of the receiving coils.

In order to realize spatial resolution in the body, constant magnetic field gradients extending along the three main axes are superposed on the uniform magnetic field $B_0$, leading to a linear spatial dependency of the spin resonance frequency. The signal picked up in the receiving coils then contains components of different frequencies which can be associated with different locations in the body. The signal data obtained via the receiving coils correspond to the spatial frequency domain and are called k-space data. The k-space data usually include multiple lines acquired with different phase encoding. Each k-space line is digitized by collecting a number of samples. A set of k-space data is converted to an MR image, e.g., by means of Fourier transformation.

In MR imaging, it is often desired to obtain information about the relative contribution of water and fat to the overall signal, either to suppress the contribution of one of them or to separately or jointly analyze the contribution of both of them. These contributions can be calculated if information from two or more corresponding echoes, acquired at different echo times, is combined. This may be considered as chemical shift encoding, in which an additional dimension, the chemical shift dimension, is defined and encoded by acquiring two or more MR images at slightly different echo times. For water-fat separation, these types of experiments are often referred to as Dixon-type of measurements. By means of Dixon MR imaging or Dixon water/fat MR imaging, a water-fat separation is achieved by deriving the relative contributions of water and fat from two or more corresponding echoes, acquired at different echo times. In general such a separation is possible because there is a known precessional frequency difference of hydrogen in water and fat.

Several Dixon-type MR imaging methods have been proposed in recent years. Apart from different strategies for the water/fat separation, the known techniques are mainly characterized by the specific number of echoes (or 'points') they acquire and by the constraints that they impose on the used echo times. Conventional two-point methods require in-phase and opposed-phase echo times at which the water and fat signals are parallel and anti-parallel in the complex plane, respectively. Eggers et al. (Magnetic Resonance in Medicine, 2011, vol. 65, p. 96-107) have proposed a flexible dual-echo Dixon-type MR imaging method. Using such Dixon-type MR imaging methods with more flexible echo times, in-phase and opposed-phase images are no longer necessarily acquired, but optionally synthesized from water and fat images.

Dixon-type MR imaging methods are often applied in combination with gradient-echo imaging. While they are commonly implemented with a dual-echo sequence, a dual-acquisition sequence is favored especially in high-resolution imaging (see Eggers et al., Journal of Magnetic Resonance Imaging, 2014, vol. 40, p. 251).

In FIG. 2, a schematic pulse sequence diagram of conventional dual-acquisition gradient-echo imaging is depicted. The diagram shows switched magnetic field gradients in the frequency-encoding (readout) direction M, the phase-encoding direction P, and the slice-selection direction S. Moreover, the diagram shows RF excitation pulses as well as the time intervals during which gradient-echo signals are acquired, designated by ACQ1 and ACQ2. The diagram covers the acquisition of the first two echo signals. In subsequent repetitions, the phase-encoding magnetic field gradients in the directions P and S are scaled to sample a pre-defined region of k-space. As illustrated in FIG. 2, a dual-acquisition Dixon gradient-echo imaging sequence generates two echoes at different echo times TE1 and TE2 after two RF excitations by shifting the readout magnetic field gradient while keeping the phase encoding magnetic field gradients and the repetition time TR fixed. Due to the shifting of the readout magnetic field gradient, different phase offsets of the contributions from water and fat to the overall signal are obtained, on the basis of which the Dixon-type water/fat separation is performed.

In comparison to standard (non-Dixon) imaging sequences, Dixon gradient-echo imaging sequences provide superior fat suppression and multiple contrasts in a single scan. However, because of the required repetition of each acquisition with identical phase encoding, scan time increases. Moreover, scan efficiency (the ratio of the acquisition time and the repetition time) decreases due to the dead time introduced to permit shifting of the readout magnetic field gradient and the acquisition windows (ACQ1, ACQ2).

SUMMARY OF THE INVENTION

It is an object of the invention to provide a method that enables a further improved Dixon water/fat separation in combination with a dual-acquisition gradient-echo imaging sequence.

In accordance with the invention, a method of MR imaging of an object placed in an examination volume of a MR device is disclosed. The method comprises the following steps:
- subjecting the object to a dual-acquisition gradient-echo imaging sequence comprising a series of temporally equidistant RF excitations, wherein one gradient echo is generated in each repetition time between successive RF excitations with the echo time alternating between a first and a second value, and wherein phase-encoding magnetic field gradients are switched in each repetition time to sample a pre-defined region of k-space;
- acquiring echo signals from the object, wherein each gradient echo associated with either the first or the second echo time value is sampled as a partial echo, and
- reconstructing an MR image from the acquired echo signals, whereby signal contributions from water and fat are separated.

According to the invention, a dual-acquisition gradient-echo imaging sequence is used to acquire two echo signals after two RF excitations, i.e. in separate repetitions. The timing and strength of the readout magnetic field gradient is chosen to shift the acquisition windows of the two echo signals such that appropriate phase offsets of the contributions from water and fat to the overall signal are obtained, on the basis of which the Dixon-type separation of these contributions is performed in the reconstruction step.

The essential feature of the invention is that the first echo, the second echo, or both echoes of the two acquisitions is/are sampled as a partial echo. The per se known partial echo technique benefits (like all partial Fourier techniques) from the complex conjugate symmetry between the k-space halves (Hermitian symmetry). The insight of the invention is that the partial-echo acquisition allows for a longer acquisition time without affecting the image resolution. In this way, the undesirable dead time in the conventional dual-acquisition Dixon gradient-echo imaging sequence can be eliminated and, as a consequence, scan efficiency can be further optimized.

In order to increase the acquisition time used for the partially sampled echo as compared to the acquisition time used for the fully sampled echo, and, thereby, scan efficiency, the duration of the re-phasing lobe of the readout magnetic field gradient associated with the partially sampled echo is increased as compared to the duration of the re-phasing lobe of the readout magnetic field gradient associated with the fully sampled echo. This fully sampled echo forming a reference at full sampling to the partially sampled echo. Simultaneously, the strength of the re-phasing lobe of the readout magnetic field gradient associated with the partially sampled echo may be reduced as compared to the strength of the re-phasing lobe of the readout magnetic field gradient associated with the fully sampled echo, while the acquisition bandwidth used for the partially sampled echo may be reduced as compared to the acquisition bandwidth used for the fully sampled echo.

In a preferred embodiment of the invention, the acquisition time used for the partially sampled echo varies during the course of the imaging sequence and is adapted to the phase encoding from repetition to repetition. The acquisition time can thus be maximized individually to such an extent that there is no interference with the phase-encoding magnetic field gradients. In other words, the partial echo factor is adapted to maximize the acquisition time under the constraints imposed by the phase-encoding magnetic field gradients. In this way, the overall scan efficiency can be maximized.

The method of the invention may be combined with the application of half scan, wherein (approximately) one half of the predefined region of k-space is acquired in the phase-encoding direction, parallel imaging (e.g. SENSE), or compressed sensing to reduce scan time.

The method of the invention described thus far can be carried out by means of an MR device including at least one main magnet coil for generating an essentially uniform, static magnetic field $B_0$ within an examination volume, a number of gradient coils for generating switched magnetic field gradients in different spatial directions within the examination volume, at least one body RF coil for generating RF pulses within the examination volume and/or for receiving MR signals from a body of a patient positioned in the examination volume, a control unit for controlling the temporal succession of RF pulses and switched magnetic field gradients, and a reconstruction unit for reconstructing MR images from the received MR signals. The method of the invention can be implemented by a corresponding programming of the reconstruction unit and/or the control unit of the MR device.

The method of the invention can be advantageously carried out on most MR devices in clinical use at present. To this end it is merely necessary to utilize a computer program by which the MR device is controlled such that it performs the above-explained method steps of the invention. The computer program may be present either on a data carrier or be present in a data network so as to be downloaded for installation in the control unit of the MR device.

BRIEF DESCRIPTION OF THE DRAWINGS

The enclosed drawings disclose preferred embodiments of the present invention. It should be understood, however, that the drawings are designed for the purpose of illustration only and not as a definition of the limits of the invention. In the drawings.

DETAILED DESCRIPTION OF THE EMBODIMENTS

Figure 1:
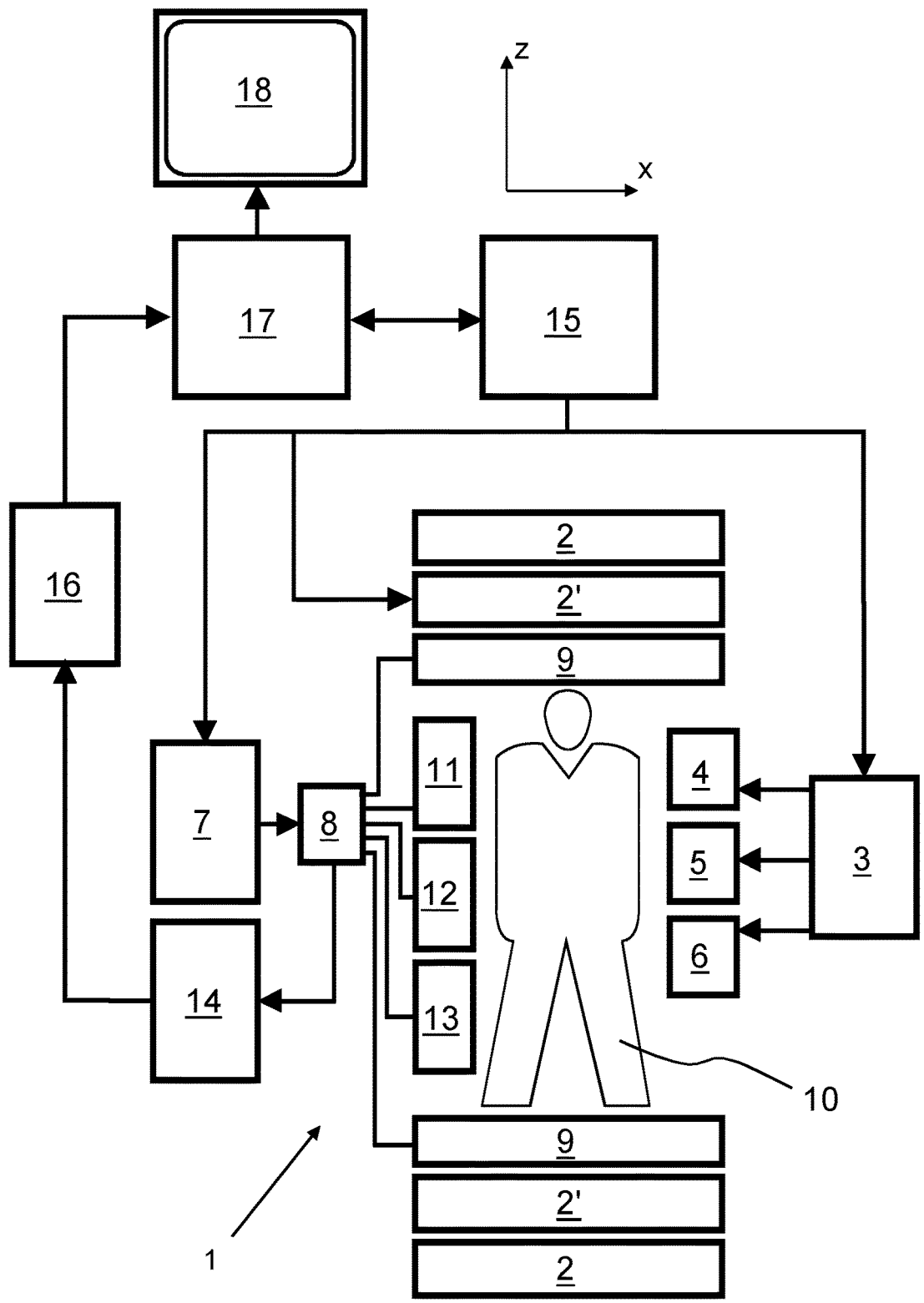
FIG. 1 shows an MR device for carrying out the method of the invention.

With reference to FIG. 1, a MR device 1 is shown as a block diagram. The device comprises superconducting or resistive main magnet coils 2 such that a substantially uniform, temporally constant main magnetic field $B_0$ is created along a z-axis through an examination volume. The device further comprises a set of ($1^{st}$, $2^{nd}$, and—where applicable—$3^{rd}$ order) shimming coils 2', wherein the current flow through the individual shimming coils of the set 2' is controllable for the purpose of minimizing $B_0$ deviations within the examination volume.

A magnetic resonance generation and manipulation system applies a series of RF pulses and switched magnetic field gradients to invert, excite, refocus, and/or spatially and otherwise encode the magnetic resonance to perform MR imaging.

More specifically, a gradient pulse amplifier 3 applies current pulses to selected ones of whole-body gradient coils 4, 5 and 6 along x, y and z-axes of the examination volume. A digital RF frequency transmitter 7 transmits RF pulses or pulse packets, via a send/receive switch 8, to a RF body coil 9 to transmit RF pulses into the examination volume. A typical MR imaging sequence is composed of a packet of RF pulse segments of short duration which, together with any applied magnetic field gradients, achieve a selected manipulation of nuclear magnetic resonance. The RF pulses are used to invert, excite, saturate, refocus, or otherwise manipulate magnetic resonance and select a portion of a body 10 positioned in the examination volume. The MR signals are also picked up by the RF body coil 9.

For generation of MR images of limited regions of the body 10, a set of local RF array coils 11, 12, 13 are placed contiguous to the region selected for imaging. The array coils 11, 12, 13 can be used to receive MR signals induced by transmissions of the RF body coil.

The resultant MR signals are picked up by the RF body coil 9 and/or by the RF array coils 11, 12, 13 and demodulated by a receiver 14 preferably including a preamplifier (not shown). The receiver 14 is connected to the RF coils 9, 11, 12 and 13 via the send/receive switch 8.

A host computer 15 controls the shimming coils 2' as well as the gradient pulse amplifier 3 and the transmitter 7 to generate the imaging sequences of the invention. For the selected sequence, the receiver 14 receives a single or a plurality of MR data lines in rapid succession following each RF excitation pulse. A data acquisition system 16 performs analog-to-digital conversion of the received signals and converts each MR data line to a digital format suitable for further processing. In modern MR devices the data acquisition system 16 is a separate computer which is specialized in acquisition of raw image data.

Ultimately, the digital raw image data are reconstructed into an image representation by a reconstruction processor 17 which applies a Fourier transform or other appropriate reconstruction algorithms, such as SENSE. The MR image may represent a planar slice through the patient, an array of parallel planar slices, a three-dimensional volume, or the like. The image is then stored in an image memory where it may be accessed for converting slices, projections, or other portions of the image representation into appropriate format for visualization, for example via a video monitor 18 which provides a man-readable display of the resultant MR image.

The host computer 15 and the reconstruction processor 17 are arranged, by corresponding programming, to perform the method of the invention described herein above and in the following.

Figure 3:
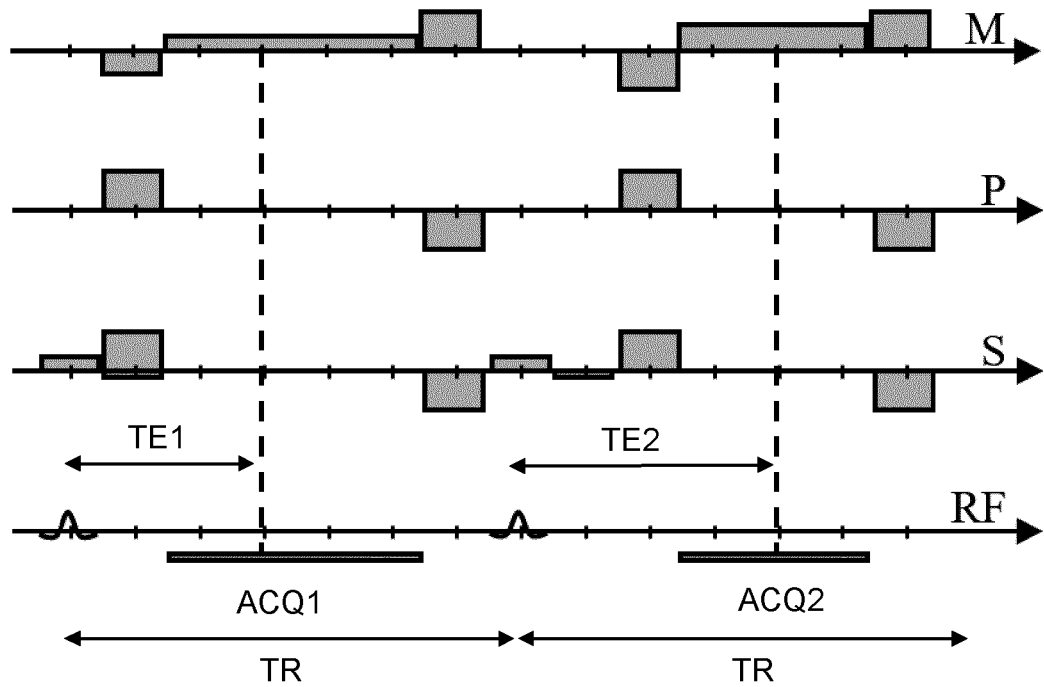
FIG. 3 shows a schematic (simplified) pulse sequence diagram according to a first embodiment of the invention.

According to the invention, a dual-acquisition Dixon gradient-echo imaging sequence with partial echo acquisition is applied. This is illustrated in FIG. 3. FIG. 3 shows a pulse sequence diagram of a 3D dual-acquisition Dixon gradient-echo sequence constituting an imaging sequence according to the invention. The diagram shows switched magnetic field gradients in the frequency-encoding direction M, the phase-encoding direction P, and the slice-selection direction S. Moreover, the diagram shows the RF excitation and refocusing pulses as well as the time intervals during which echo signals are acquired, designated by ACQ1 and ACQ2. One gradient echo is generated in each repetition time between successive RF excitations. The diagram covers the acquisition of the first two echo signals. In subsequent repetition times, the phase-encoding magnetic field gradients in the directions P and S are scaled to sample a pre-defined region of k-space. The two echoes are generated at different echo times TE1 and TE2 after two RF excitations by shifting the readout magnetic field gradient f while keeping the phase-encoding magnetic field gradients and the repetition time TR fixed. Due to the shifting of the readout magnetic field gradient and the resulting different echo times TE1 and TE2, different phase offsets of the contributions from water and fat to the overall signal are obtained, on the basis of which the Dixon-type water/fat separation is performed.

Figure 2:
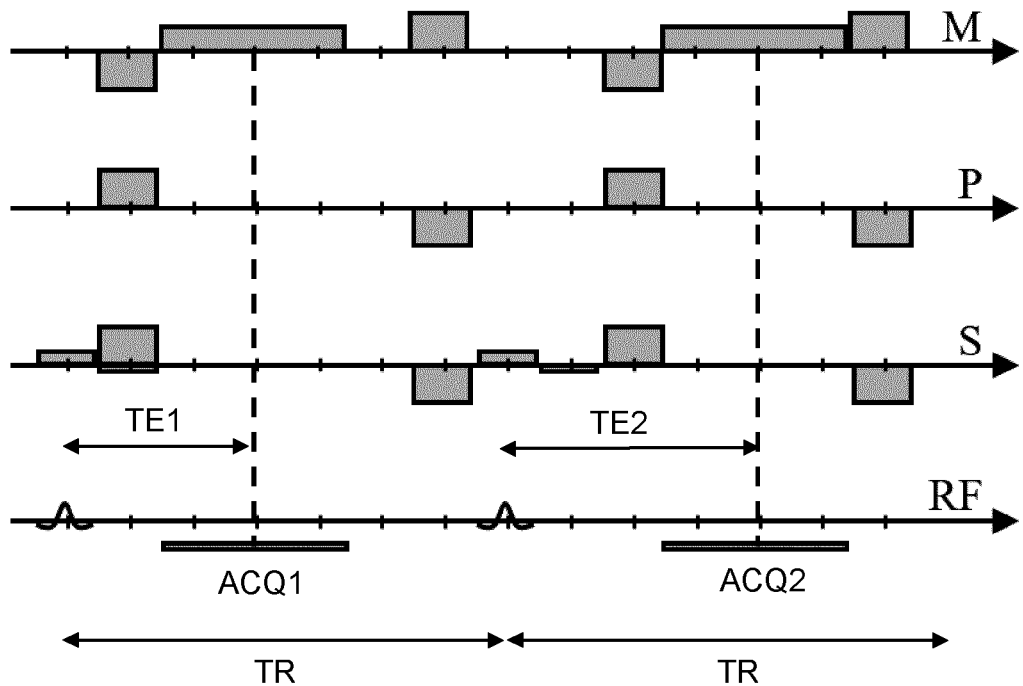
FIG. 2 shows a schematic (simplified) pulse sequence diagram of a conventional dual-acquisition Dixon gradient-echo imaging sequence.
Figure 4:
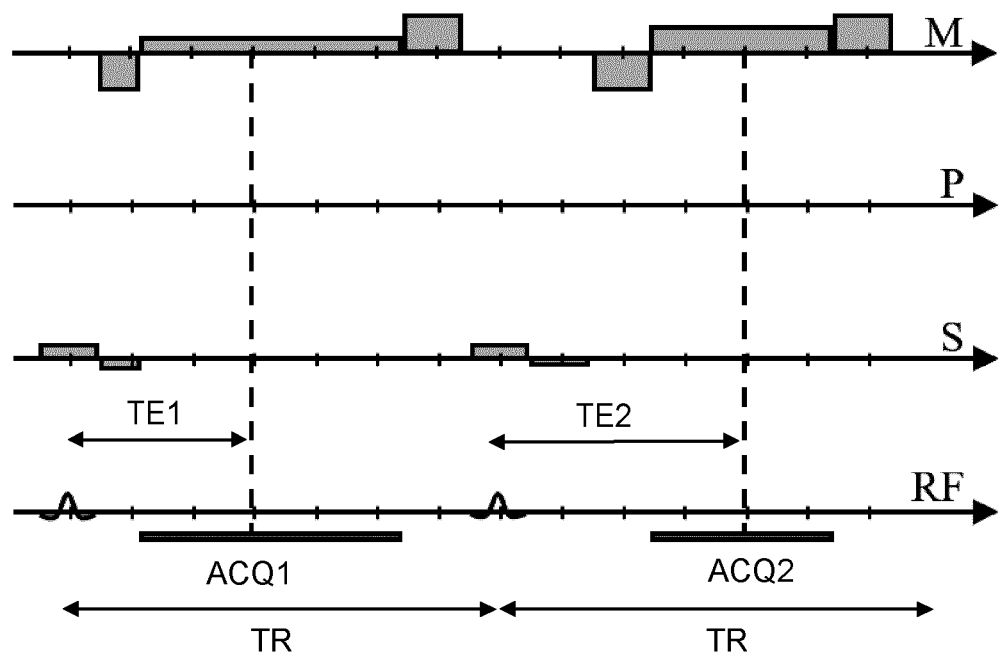
FIG. 4 shows a schematic (simplified) pulse sequence diagram according to the first embodiment of the invention without phase-encoding magnetic field gradients.
Figure 5:
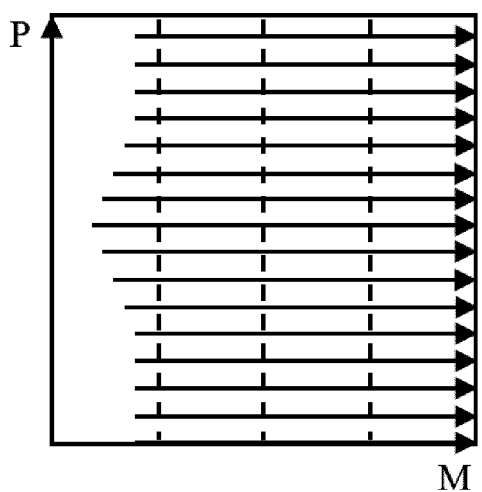
FIG. 5 shows a k-space diagram illustrating the variation of the partial echo factor with the phase encoding.

In the embodiment of FIG. 3, the full echo acquisition ACQ1 of the first echo (see FIG. 2) is replaced by a partial echo acquisition. The duration of the re-phasing lobe of the readout magnetic field gradient and the acquisition time are increased, while the echo time TE1 and the repetition time TR are fixed. In this way, the dead time present in the conventional acquisition scheme (FIG. 2) is eliminated. The strength of the re-phasing lobe of the readout magnetic field gradient and the receive bandwidth are decreased accordingly. The leading part of the echo is thus sampled only partially, and the leading part of the re-phasing lobe of the readout magnetic field gradient is removed. The area of the latter is added to the de-phasing lobe of the readout magnetic field gradient, which reduces its strength. Within the constraints imposed by the concurrent phase-encoding magnetic field gradients in the directions P and S, the de-phasing lobe of the readout magnetic field gradient can be shortened as far as possible to further improve scan efficiency. The extent to which the partial echo factor can be increased varies throughout the sequence with the strengths of the phase-encoding magnetic field gradients. This is illustrated in FIG. 4 for the case of no phase encoding at all, where the de-phasing lobe of the readout magnetic field gradient is shortest. In FIG. 5, the adaptation of the partial echo factor to the phase-encoding gradients is illustrated, for the sake of simplicity, in an only two-dimensional (M, P) k-space diagram. A maximum fraction of k-space in the M direction is sampled in the central region in P direction, while a smaller fraction is sampled in the more peripheral regions in P direction.

Figure 6:
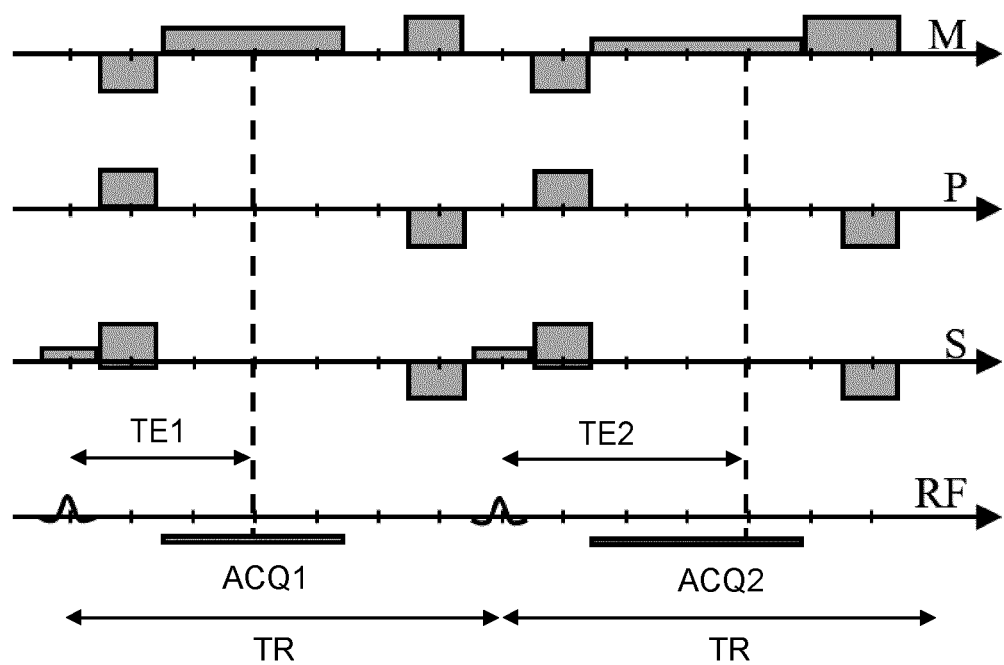
FIG. 6 shows a schematic (simplified) pulse sequence diagram according to a second embodiment of the invention.

In the embodiment in FIG. 6, the full echo acquisition ACQ2 of the second echo (see FIG. 2) is replaced by a partial echo acquisition. Again, the length of the corresponding re-phasing lobe of the readout magnetic field gradient and the acquisition time are increased, while the echo time TE2 and the repetition time TR are kept fixed, until the dead time is eliminated. The strength of the re-phasing lobe of the readout magnetic field gradient and the receive bandwidth are decreased accordingly. In this way, the trailing part of the echo is sampled only partially, and the trailing part of the re-phasing lobe of the readout magnetic field gradient is removed. The area of the latter is added to the spoiling lobe of the readout magnetic field gradient, which increases its strength and possibly its length.

In a possible embodiment, the full echo acquisitions ACQ1 and ACQ2 of the first and second echo are both replaced by partial echo acquisitions described above. Moreover, depending on the desired spatial resolutions in the M, P, and S directions, the concept of varying the partial echo factors with the phase encoding may also advantageously be applied to the second partial echo acquisition ACQ2, for instance in combination with varying the second echo time TE2 slightly. The latter may entail performing the water-fat separation in k-space instead of in image space to take the actual acquisition time of each sample into account.

The invention claimed is:

1. A method of magnetic resonance (MR) imaging of an object placed in an examination volume of an MR device the method comprising:
    subjecting the object to a dual-acquisition gradient-echo imaging sequence comprising a series of temporally equidistant RF excitations, wherein one gradient echo is generated in each repetition time between successive RF excitations with the echo time alternating between a first and a second value (TE1, TE2), and wherein phase-encoding magnetic field gradients (P, S) are switched in each repetition time to sample a pre-defined region of k-space;
    acquiring echo signals from the object, wherein each gradient echo associated with either the first or the second echo time value (TE1, TE2) is sampled as a partial echo, wherein the duration of the re-phasing lobe of the readout magnetic field gradient associated with the partially sampled echo is increased as compared to the duration of the re-phasing lobe of the readout magnetic field gradient associated with its corresponding fully sampled echo;
    and
    reconstructing an MR image from the acquired echo signals, whereby signal contributions from water and fat are separated.

2. The method of claim 1, wherein the strength of the re-phasing lobe of the readout magnetic field gradient associated with the partially sampled echo is reduced as compared to the strength of the re-phasing lobe of the readout magnetic field gradient associated with the fully sampled echo.

3. The method of claim 1, wherein the acquisition time used for the partially sampled echo is increased as compared to the acquisition time used for the fully sampled echo.

4. The method of claim 1, wherein the acquisition bandwidth used for the partially sampled echo is reduced as compared to the acquisition bandwidth used for the fully sampled echo.

5. The method of claim 1, with the echo time alternating between a first and a second value (TE1, TE2) to generate a shorter echo time gradient echo and a longer echo time gradient echo, respectively and wherein
    the leading end of the shorter echo time gradient echo is partially sampled and/or the trailing end of the longer echo time gradient echo is partially sampled.

6. The method of claim 1, wherein the acquisition time used for the partially sampled echo varies during the course of the imaging sequence and is adapted to the phase encoding.

7. A magnetic resonance (MR) device comprising at least one main magnet coil for generating a uniform, static magnetic field $B_0$ within an examination volume, a number of gradient coils for generating switched magnetic field gradients in different spatial directions within the examination volume, at least one RF coil for generating RF pulses within the examination volume and/or for receiving MR signals from an object positioned in the examination volume, a control unit for controlling the temporal succession of RF pulses and switched magnetic field gradients, and a reconstruction unit for reconstructing MR images from the received MR signals, wherein the MR device is configured to perform the steps of the method of claim 1.

8. A computer program to be run on a magnetic resonance (MR) device, which computer program comprises instructions stored on non-transitory computer readable medium for executing the method of claim 1.

* * * * *